United States Patent
Camp et al.

(10) Patent No.: US 10,826,538 B1
(45) Date of Patent: Nov. 3, 2020

(54) EFFICIENT ERROR CORRECTION OF CODEWORDS ENCODED BY BINARY SYMMETRY-INVARIANT PRODUCT CODES

(71) Applicant: INTERNATIONAL BUSINESS MACHINES CORPORATION, Armonk, NY (US)

(72) Inventors: Charles Camp, Sugar Land, TX (US); Milos Stanisavljevic, Adliswil (CH); Robert Allan Cyprus, Sugar Land, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/439,197

(22) Filed: Jun. 12, 2019

(51) Int. Cl.
H03M 13/29 (2006.01)

(52) U.S. Cl.
CPC ... H03M 13/2927 (2013.01); H03M 13/2903 (2013.01); H03M 13/2909 (2013.01); H03M 13/2948 (2013.01)

(58) Field of Classification Search
CPC .................. H03M 13/2927; H03M 13/2909
See application file for complete search history.

(56) References Cited

U.S. PATENT DOCUMENTS

| | | | |
|---|---|---|---|
| 5,712,861 A * | 1/1998 | Inoue | H03M 13/151 714/752 |
| 7,774,688 B1 | 8/2010 | Teng et al. | |
| 8,499,219 B2 | 7/2013 | Wang | |
| 8,762,821 B2 | 6/2014 | Wu et al. | |
| 9,166,626 B2 | 10/2015 | Ha et al. | |
| 9,397,705 B2 | 7/2016 | Yen et al. | |

(Continued)

FOREIGN PATENT DOCUMENTS

DE 102017216264 A1 3/2019

OTHER PUBLICATIONS

Hager, C. et al. (Sep. 2016). Density evolution for deterministic generalized product codes with higher-order modulation. 2016 9th International Symposium on Turbo Codes and Iterative Information Processing (ISTC), 236-240. doi: 10.1109/istc.2016.7593112.

(Continued)

*Primary Examiner* — Joseph D Torres
(74) *Attorney, Agent, or Firm* — Brian F. Russell; Stosch Sabo

(57) ABSTRACT

A decoder for decoding a binary symmetry-invariant product code includes a data array having orthogonal first and second dimensions. The data array is configured to access a binary symmetry-invariant product code buffered therein along only the first dimension. The decoder also includes an error storage array for storing error locations and a first correction circuit configured to detect and correct errors in data accessed from the data array along the first dimension and to store error locations along the second dimension in the error storage array. The first correction circuit determines the error locations based on data symmetry of the symmetry-invariant product code. The decoder also includes a second correction circuit that, prior to receipt by the first correction circuit of data accessed from the data array along the first dimension, corrects the data accessed from the data array based on the error locations stored in the error storage array.

20 Claims, 12 Drawing Sheets

(56) References Cited

U.S. PATENT DOCUMENTS

| | | |
|---|---|---|
| 9,760,435 B2 | 9/2017 | Das |
| 9,996,420 B2 | 6/2018 | Mittelholzer et al. |
| 10,009,043 B2 | 6/2018 | Motwani |
| 10,103,750 B2 | 10/2018 | Sugihara et al. |
| 2011/0099452 A1 | 4/2011 | Rumbolt et al. |
| 2014/0173386 A1 | 6/2014 | Kern et al. |
| 2015/0309875 A1* | 10/2015 | Mittelholzer ....... G06F 11/1076 714/766 |
| 2016/0188230 A1* | 6/2016 | Blaettler ............... G06F 3/0619 711/162 |
| 2018/0006667 A1* | 1/2018 | Motwani ............... H04L 1/0057 |
| 2018/0115325 A1* | 4/2018 | Blaettler ........... H03M 13/2948 |
| 2018/0167088 A1 | 6/2018 | Vakilinia et al. |
| 2018/0205398 A1 | 7/2018 | Shany et al. |
| 2019/0089379 A1* | 3/2019 | Pfister ................. H03M 13/152 |

OTHER PUBLICATIONS

Hager, C., & Pfister, H. D. (Mar. 2018). Approaching miscorrection-free performance of product codes with anchor decoding. IEEE Transactions on Communications, 66(7), 2797-2808. doi: 10.1109/tcomm.2018.2816073.

Mittelholzer, T. et al. (Oct. 2015). Symmetry-based subproduct codes. 2015 IEEE International Symposium on Information Theory (ISIT), 251-255. doi: 10.1109/isit.2015.7282455.

Camp, Charles et al. U.S. Appl. No. 16/439,197, filed Jun. 12, 2020—Appendix P.

Hager et al.; "Density Evolution for Deterministic Generalized Product Codes With Higher-Order Modulation", Jun. 21, 2016.

Emmadi et al.; "Half-Product Codes Flash Memory", Mar. 2015.

Mittelholzer et al.; "Improving the Error-Floor Performance of Binary Half-Product Codes", Oct. 2016.

Hager et al.; "Approaching Miscorrection-Free Performance of Product and Generalized Product Codes", Nov. 21, 2017.

* cited by examiner

EFFICIENT ERROR CORRECTION OF CODEWORDS ENCODED BY BINARY SYMMETRY-INVARIANT PRODUCT CODES

BACKGROUND OF THE INVENTION

This disclosure relates to data processing, and more specifically, to efficient error correction of data encoded utilizing binary symmetry-invariant product codes (e.g., half product codes), for example, in data storage systems or data communication systems.

Error-correction encoding is employed in data storage systems and data communication systems to improve the accuracy with which data can be recovered from a data channel. By encoding data in accordance with an error-correction code (ECC) before supplying the data to the channel, errors at the channel output can be identified and corrected to an extent dependent on the properties of the ECC. Numerous such ECC schemes are known. One well-known class of ECC scheme is based on product codes. A product code uses two component ECC codes to encode rows and columns of a notional two-dimensional array of input data.

The basic structure of a conventional product code is illustrated schematically in FIG. 1. The input data symbols (which in general may be $q^{ary}$ symbols, having q possible symbol values, where q≥2) are assigned to respective symbol locations in a notional array having $n_2$ rows and $n_1$ columns of symbol locations. In this example, $k_2 \times k_1$ data symbols are assigned to respective locations in a $k_2$ by $k_1$ subarray at the intersection of the first $k_2$ rows and first $k_1$ columns of the $n_2$ by $n_1$ array. The resulting array of input data symbols is encoded by separately encoding the rows and columns of the array. A first ECC code C1 is used to encode the $k_1$-symbol data word in each row of the array into a length-$n_1$ C1 codeword. This example uses systematic encoding, whereby the input data is retained in the codeword. In particular, the $n_1$ code symbols of a C1 codeword are obtained by adding $(n_1-k_1)$ parity symbols after the $k_1$-symbol data word in a given row. A second ECC code C2 is then used to encode the $k_2$-symbols in each column of the array into a length-$n_2$ C2 codeword, here by adding $(n_2-k_2)$ parity symbols at the end of each column. The resulting $n_2 \times n_1$ code symbols in the array form the output codeword of the product code. In an extension of this basic idea, an interleaved product code applies the C2 code over s>1 evenly spaced columns of the array, resulting in $n_1/s$ C2 codewords.

Product codes can offer practical encoder/decoder implementations, their decoders being hard-decision based and thus avoiding the various complexity and latency issues associated with soft-decision decoding. Some decoders for interleaved product codes use the technique of iterative decoding based on a graph defined from the basic code structure. Briefly, a bipartite graph can be defined with $n_2$ right nodes, each corresponding to a C1 codeword, and $n_1/s$ left nodes corresponding to respective C2 codewords. Each right node is connected to each left node by s edges. The s edges connecting a pair of nodes represent the s common symbols at the intersections of the C1 and C2 codewords for those nodes in the notional array described above. Iterative decoding is performed based on the graph by decoding the C1 codewords one-by-one, then decoding the C2 codewords one-by-one. Each time a codeword is successfully decoded, the edges leaving the appropriate node are corrected. The process iterates until decoding is complete, that is, either no more errors are detected by the decoder or a predetermined maximum number of iterations has been reached, in which case, the decoder may declare a decoding failure.

Another ECC scheme based on product codes was proposed in the context of optical transmission networks (OTNs) in J. Justesen, "Error correcting coding for OTN," IEEE Communications Magazine, September 2010, and J. Justesen, Performance of Product Codes and Related Structures with Iterative Decoding, IEEE Transactions on Communications, 2011. These codes, referred to as half product codes (HPCs), are product codes which use identical codes for the row code C1 and the column code C2. If each component code C1 and C2 is a rate k/n code with a code length (i.e., number of symbols in a codeword) of n, and a dimension (i.e., number of data symbols encoded into each codeword) of k, then the resulting product code C has length $N=n^2$, dimension $K=k^2$, and rate $(k/n)^2$. A codeword of C can be defined by an (n by n)-symbol matrix X corresponding to the notional array described above, where each row and column of X is a codeword of the row/column code. The corresponding half product code $C_H$ is then defined by $C_H = \{X - X^T : X \in C\}$, where $X^T$ is the transpose matrix of X.

Note that if X is a codeword then so is $X^T$ because the row and column codes are the same. By construction, every codeword $Y_H$ of $C_H$ has a zero major diagonal (although either major diagonal can be a zero major diagonal, the zero major diagonal is defined herein as the line of symbols extending diagonally across the (n by n)-symbol matrix $Y_H$ from the top right symbol to the bottom left symbol). That is, all symbols on the zero major diagonal are of value zero. Since it follows from the definition of $C_H$ that $Y_H = Y_H^T$, the set of n(n−1)/2 symbols in the triangular subarray on each side of the zero major diagonal is the same. These n(n−1)/2 symbols thus define the codeword $Y_H$ such that the half product code has an effective length of $N_H = n(n-1)/2$. With HPCs, encoding and iterative decoding is conventionally performed in the same manner as for product codes, but the input data is restricted to the triangular subarray on one side of the zero major diagonal, giving a dimension of $K_H = k(k-1)/2$ for the HPC.

An exemplary prior art HPC 200 is illustrated in FIG. 2. To form HPC 200, the original input data 204 is placed in a square array below zero major diagonal 202. Symmetrical duplicate data 206 is then formed by copying original input data 204, transposing the original input data, and placing the resulting data above zero major diagonal 202. Parity data 208 is then computed (e.g., utilizing a Bose-Chaudhuri-Hocquenghem (BCH) error correction function) separately for each row and column. After encoding, because of data symmetry, only the portion of the array above or below the zero major diagonal 202 needs to be stored and/or transmitted.

When data is retrieved from memory or received via a data transmission, HPC 200 can be reconstructed by duplicating and transposing the retrieved/received data to fill the array. Any errors arising during the storage, retention, retrieval, and/or transmission of the data will therefore also be symmetric about the zero major diagonal of the reconstructed array, as shown in FIG. 3. During conventional decoding (i.e., the error correction process in which rows and columns are iteratively processed to correct row and column errors), data in the array is first accessed in a row format and then accessed in a columnar format.

In real world implementations, standard software approaches do not generally duplicate data in CPU memory, but rather operate on only one set of data and benefit from an implicit correction of duplicate errors. Assume in FIG. 3 that rows are processed from the bottom to the top of the array. If only one copy of each bit is stored in CPU memory, correcting the row containing errors at A, B, and C inherently results in correct values for A, B, and C in the three subsequent rows containing these bit values. While seemingly efficient, this software-based approach has much higher latency than hardware-based solutions and is therefore unsuitable for truly high-performance applications.

To achieve high performance decoding, hardware implementations of HPC decoding will typically form a full HPC array (including duplicate data 206) in memory and then iteratively decode each row one-by-one and then each column one-by-one. While this approach offers much higher performance than a conventional software implementation, the present disclosure appreciates that the circuitry that enables the data to be accessed in both row and column format is very expensive. The present disclosure also appreciates that conventional hardware implementations require both row and column data to be independently read and corrected, meaning that hardware HPC decoding implementations do not benefit from the array symmetry.

BRIEF SUMMARY

In at least one embodiment, a decoder performs, in hardware, iterative decoding of codewords encoded by a binary symmetry-invariant product code, such as a half product code (HPC). A symmetry-invariant product code buffered in a data array is accessed along only a first dimension of the data array, and errors in the data of the symmetry-invariant product code are detected and corrected by an error correction circuit. As errors are detected, error locations for an orthogonal second dimension of the data array are stored in an error storage array, where the error locations are determined based on the known data symmetry of the symmetry-invariant product code. Based on the stored error locations, errors are corrected "on the fly" as data is accessed from the data array and sent to the error correction circuit.

DETAILED DESCRIPTION

In at least one aspect, the present application is directed to a decoder that performs, in hardware circuitry, iterative decoding of codewords encoded by a binary symmetry-invariant product code, such as a half product code (HPC). A symmetry-invariant product code buffered in a data array is accessed along only a first dimension of the data array, and errors in the data of the symmetry-invariant product code are detected and corrected by a first correction circuit. As errors are detected, error locations for an orthogonal second dimension of the data array are stored in an error storage array, where the error locations are determined based on the known data symmetry of the symmetry-invariant product code. Based on the stored error locations, errors are corrected "on the fly" by a second correction circuit as data is accessed from the data array and sent to the first correction circuit. The application is further directed to related methods and program products.

Although the inventions described herein can be applied to conventional HPCs as discussed above, it should be appreciated that the invention disclosed herein are also applicable to symmetry-invariant product codes formed with more than one type of component code per row and more than one type of component code per column. Similarly, further extensions of HPCs can be obtained by using more than one type of component code in the code constructions. For example, one may use two types of component codes of the same length n but with different error correction capabilities $t_1$ and $t_2$. In the HPC case, one may require that the first half of the row/columns are codewords from the $t_1$-error correcting component code, and the second half of the row/columns are codewords from the $t_2$-error correcting component code.

Figure 1:
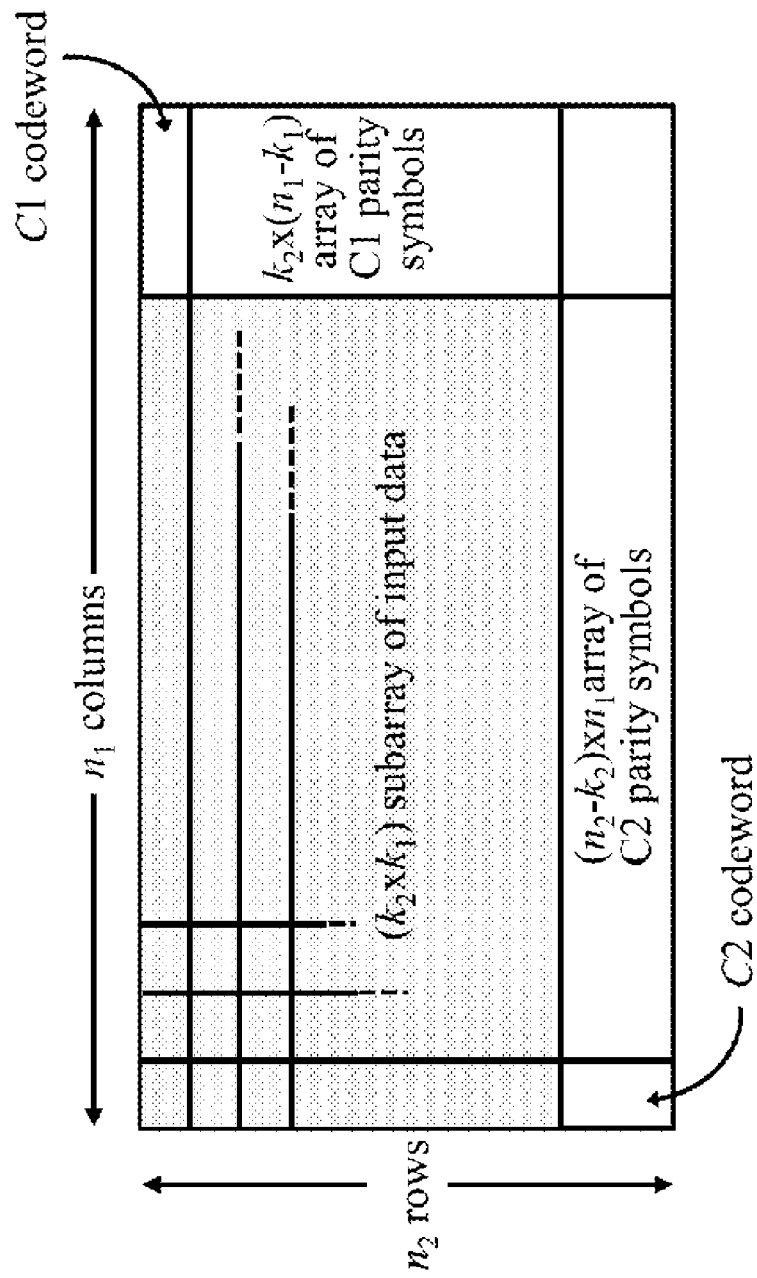
FIG. 1 illustrates a prior art product code.
Figure 2:
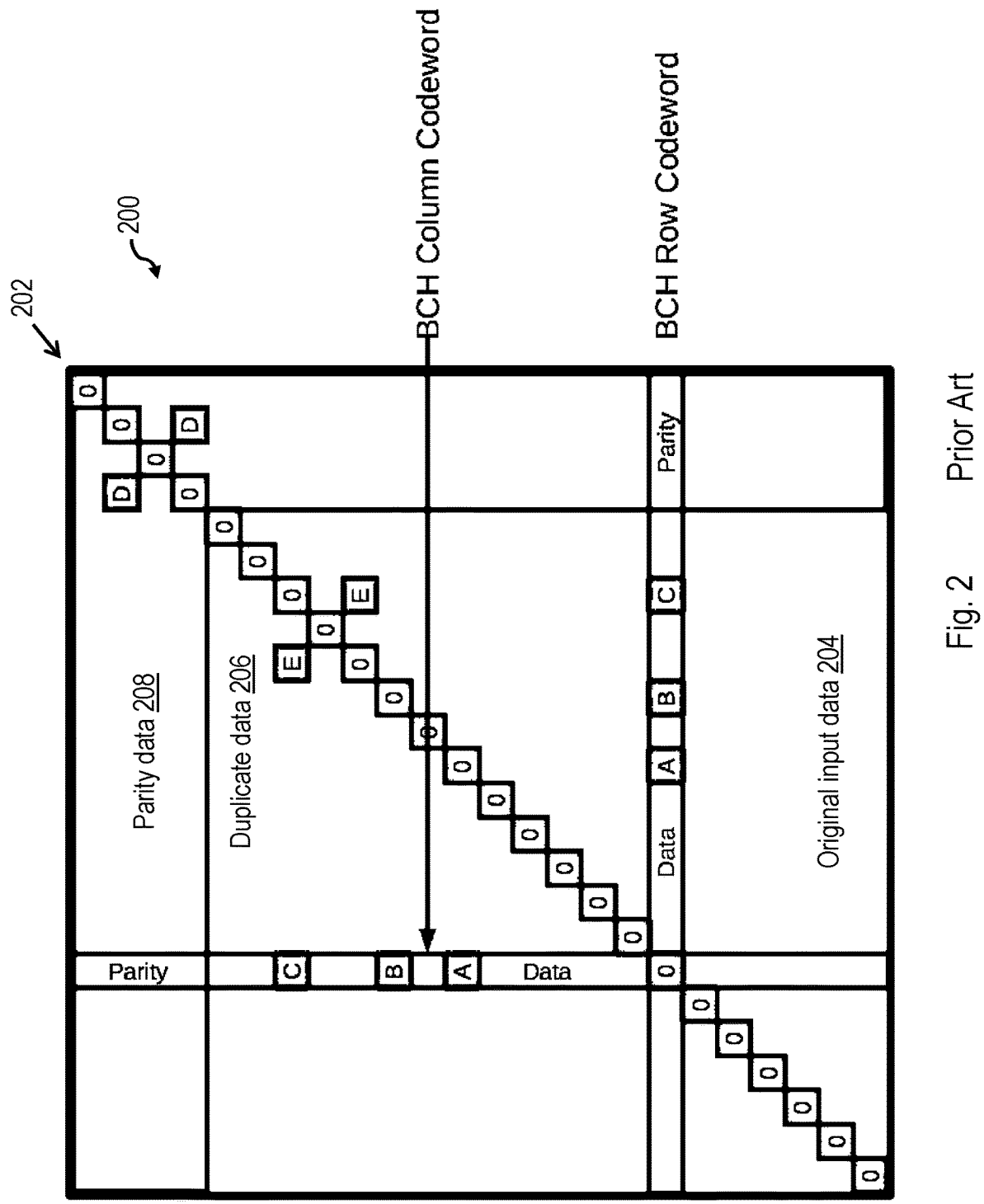
FIG. 2 illustrates a prior art half product code (HPC)
Figure 3:
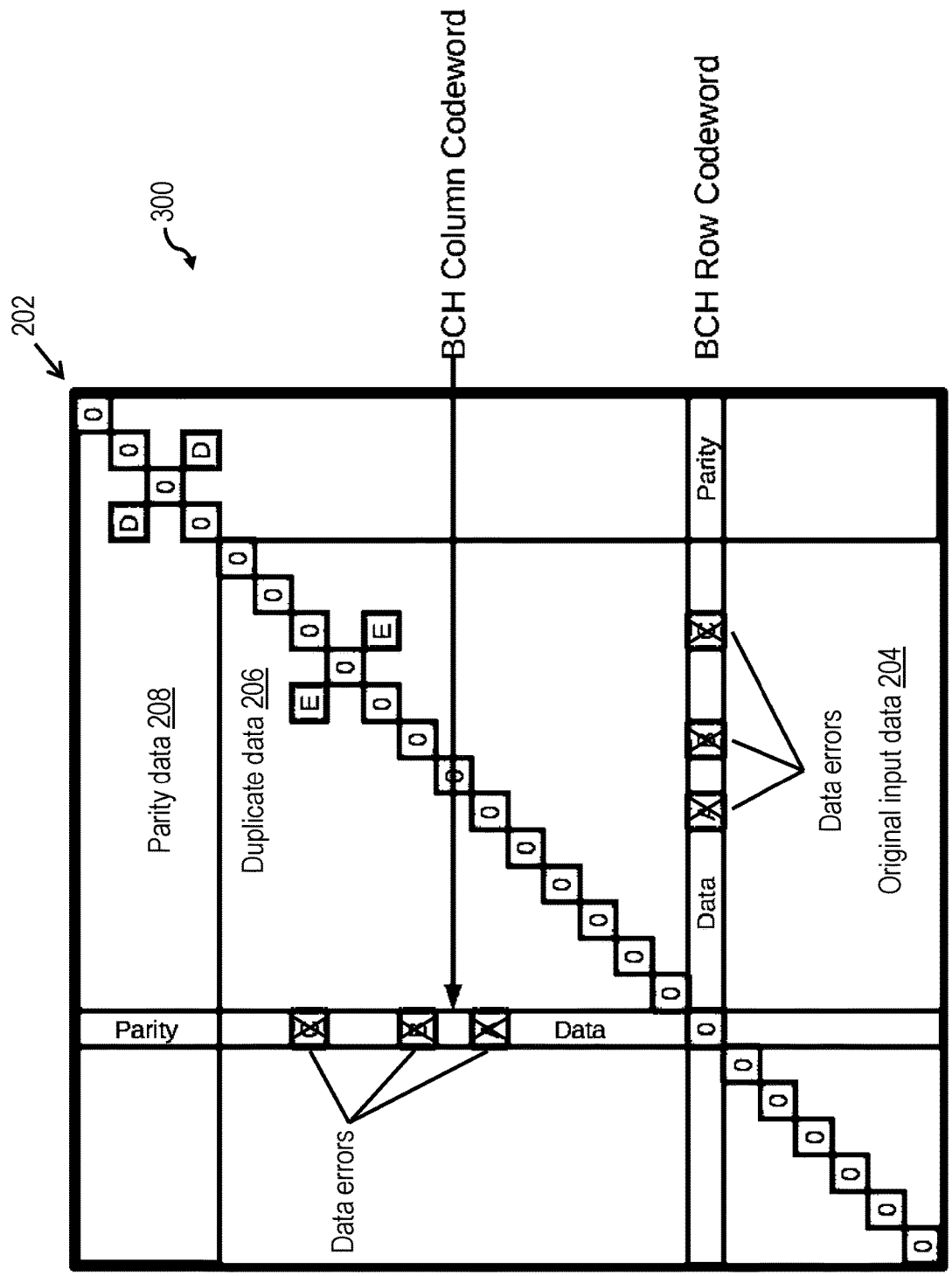
FIG. 3 depicts a prior art HPC containing symmetrical data errors.
Figure 4:
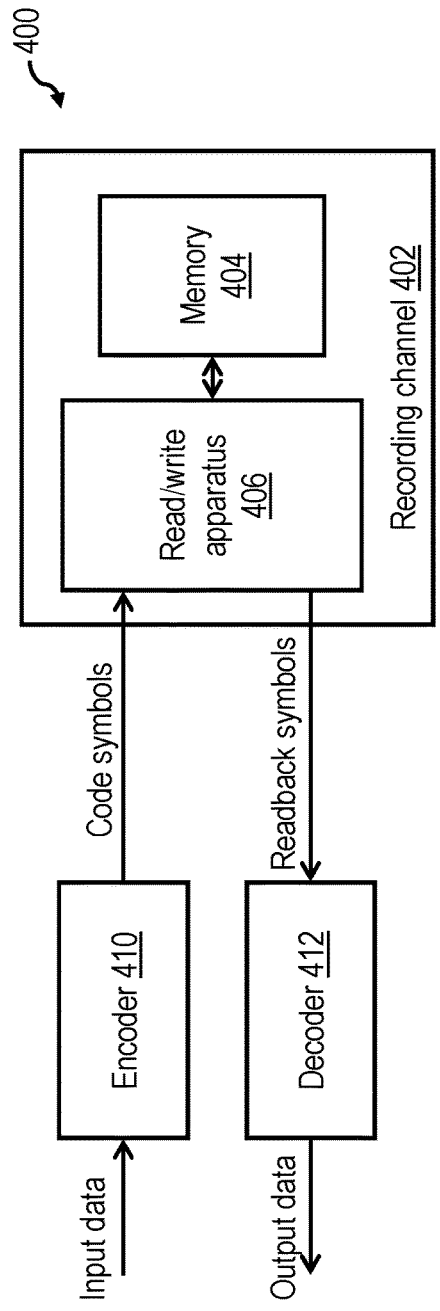
FIG. 4 is a high-level block diagram of a data storage system in accordance with one embodiment.

With reference again to the figures and in particular with reference to FIG. 4, there is a high-level block diagram of an exemplary embodiment of a data storage system 400 for reading and writing ECC-encoded data on a data storage device. Data storage system 400 includes a recording channel 402 including a memory 404 (e.g., a flash memory or other non-volatile random access memory (NVRAM)) and a read/write apparatus 406 for reading and writing data in memory 404. Although shown in FIG. 4 as a single block, memory 404 may comprise any desired configuration of data storage units ranging, for example, from a single chip or die to a plurality of storage banks each including multiple packages of memory chips. Read/write apparatus 406 performs read and write operations in known manner, addressing memory cells for read and write purposes by applying appropriate voltages to an array of word and bit lines in memory 404.

Data storage system 400 further includes an encoder 410 and a decoder 412. Encoder 410 encodes input data into code symbols in accordance with a binary symmetry-invariant product code (e.g., an HPC) and outputs the code symbols to recording channel 402. Decoder 412 processes the readback symbols obtained by read/write apparatus 406 from memory 404 to decode the symmetry-invariant product code and so recover and output the original input data.

Figure 5:
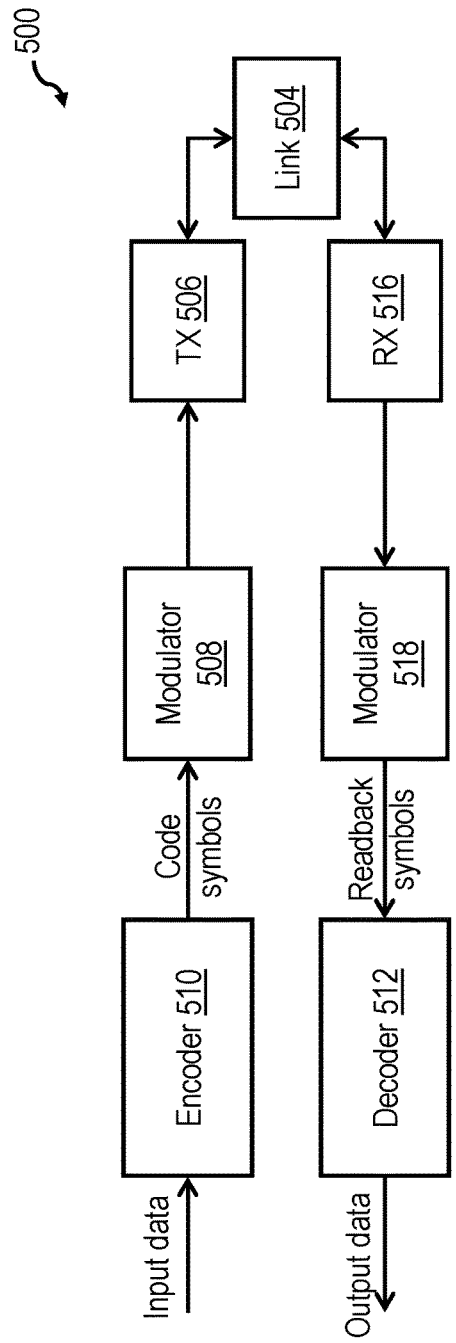
FIG. 5 is a high-level block diagram of a data communication system in accordance with one embodiment.

As further illustrated in FIG. 5, symmetry-invariant product codes such as HPCs also find application in data communication systems, such as data communication system 500. The transmitter of data communication system 500 includes an encoder 510 as described above with reference to FIG. 4, a modulator 508, and a transmission device (TX) 506. Code symbols output by encoder 510 are supplied, via modulator 508, to transmission device 506, which generates a signal for transmitting the code symbols over a communications link 504. Communications link 504 may comprise a physical (wired or wireless) link or a logical link over one or more physical links. A receiver of the data communication system includes a receiving device (RX) 516 for receiving the signal transmitted over link 504, a demodulator 518 for demodulating the received signal, and a decoder 512 as described above for decoding the resulting code symbols received from demodulator 518.

In preferred embodiments, the functionality of encoders 410, 510 and decoders 412, 512 is implemented in hardware circuitry (i.e., integrated circuitry) in order to achieve high performance. In other embodiments, however, the functionality of encoders 410, 510 and decoders 412, 512 can be implemented in hardware executing program instructions of software and/or firmware. For example, encoding and decoding can be performed in whole or in part through the execution of software that configures one or more processors as encoders and/or decoders to perform the encoding and decoding.

Figure 6:
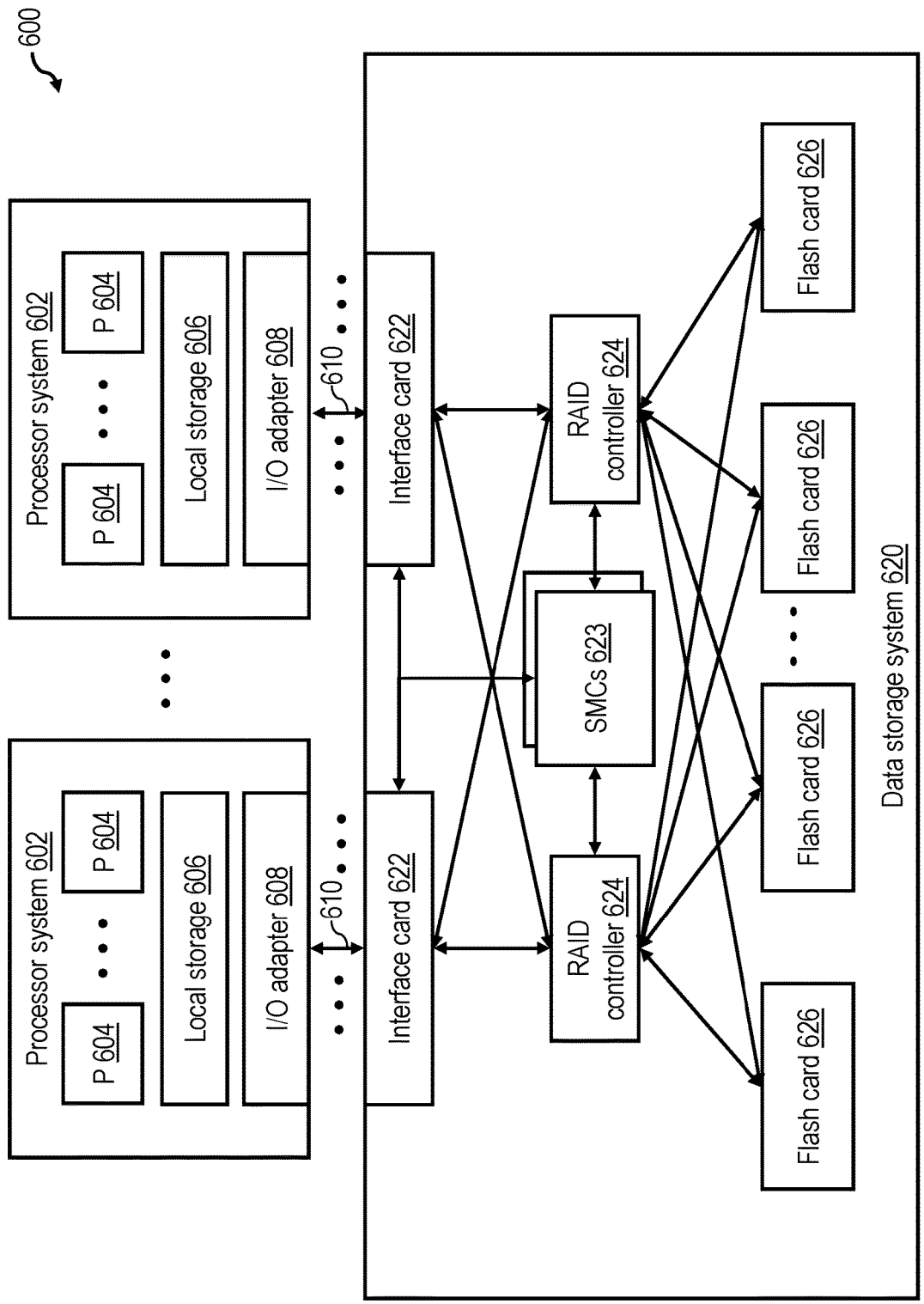
FIGS. 6-7 illustrate an exemplary implementation of the data storage system of FIG. 4.
Figure 7:
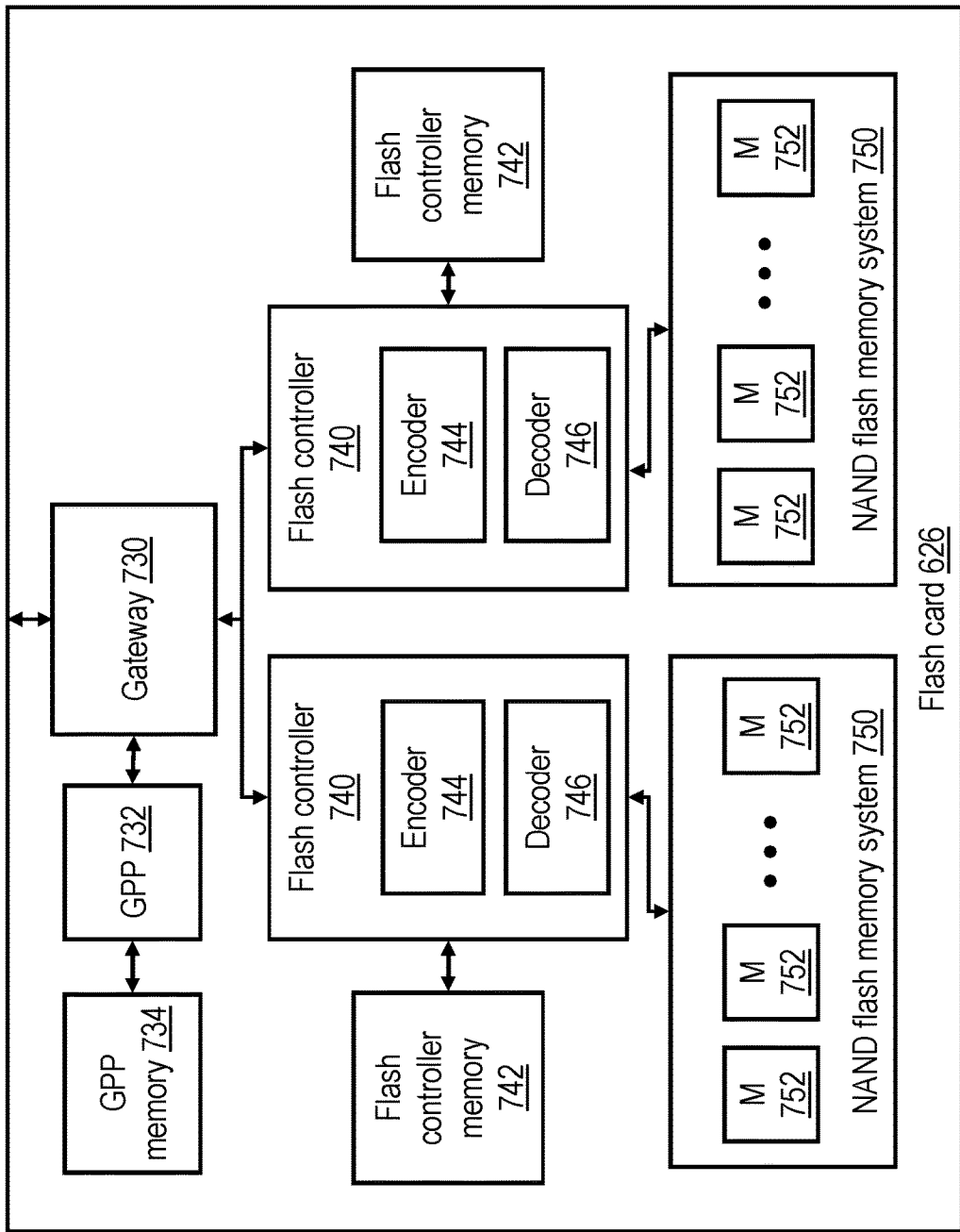

Referring now to FIGS. 6-7, there are depicted more detailed block diagrams of an exemplary implementation of a data storage system, such as data storage system 400 of FIG. 4. FIG. 6 illustrates a data processing environment 600 including one or more hosts, such as a processor system 602 having one or more processors 604 that process instructions and data. A processor system 602 may additionally include local storage 606 (e.g., dynamic random access memory (DRAM) or disks) that may store program code, operands and/or execution results of the processing performed by processor(s) 604. In various embodiments, a processor system 602 can be, for example, a mobile computing device (such as a smartphone or tablet), a laptop or desktop personal computer system, a server computer system (such as one of the POWER series of servers available from International Business Machines Corporation), or a mainframe computer system. A processor system 602 can also be an embedded processor system using various processors such as ARM, POWER, Intel X86, or any other processor combined with any of memory caches, memory controllers, local storage, I/O bus hubs, etc.

Each processor system 602 further includes an input/output (I/O) adapter 608 that is coupled directly (i.e., without any intervening device) or indirectly (i.e., through at least one intermediate device) to a data storage system 620 via an I/O channel 610. In various embodiments, I/O channel 610 may employ any one or a combination of known or future developed communication protocols, including, for example, Fibre Channel (FC), FC over Ethernet (FCoE), Internet Small Computer System Interface (iSCSI), InfiniBand, Transport Control Protocol/Internet Protocol (TCP/IP), Peripheral Component Interconnect Express (PCIe), etc. I/O requests communicated via I/O channel 610 include read requests by which a processor system 602 requests data from data storage system 620 and write requests by which a processor system 602 requests storage of data in data storage system 620.

Although not required, in the illustrated embodiment, data storage system 620 includes multiple interface cards 622 through which data storage system 620 receives and responds to I/O requests of hosts via I/O channels 610. Each interface card 622 is coupled to each of multiple Redundant Array of Inexpensive Disks (RAID) controllers 624 in order to facilitate fault tolerance and load balancing. Each of RAID controllers 624 is in turn coupled (e.g., by a PCIe bus) to non-volatile storage media, which in the illustrated example include multiple flash cards 626 bearing NAND flash memory. In other embodiments, alternative and/or additional non-volatile storage devices can be employed.

In the depicted embodiment, the operation of data storage system 620 is managed by redundant system management controllers (SMCs) 623, which are coupled to interface cards 622 and RAID controllers 624. In various embodiments, system management controller 623 can be implemented utilizing hardware or hardware executing firmware and/or software.

FIG. 7 depicts a more detailed block diagram of an exemplary embodiment of a flash card 626 of data storage system 620 of FIG. 6. Flash card 626 includes a gateway 730 that serves as an interface between flash card 626 and RAID controllers 624. Gateway 730 is coupled to a general-purpose processor (GPP) 732, which can be configured (e.g., by program code) to perform pre-processing on I/O requests received by gateway 730 and/or to schedule servicing of the I/O requests by flash card 626. GPP 732 is coupled to a GPP memory 734 (e.g., Dynamic Random Access Memory (DRAM)) that can conveniently buffer data created, referenced and/or modified by GPP 732 in the course of its processing or data flowing through the gateway 730 destined for one or more of the flash controllers 740.

Gateway 730 is further coupled to multiple flash controllers 740, each of which controls a respective NAND flash memory system 750. Flash controllers 740 can be implemented, for example, by an Application Specific Integrated Circuit (ASIC) and/or a Field Programmable Gate Array (FPGA) and/or a microprocessor, and each have an associated flash controller memory 742 (e.g., DRAM). In embodiments in which flash controllers 740 are implemented with an FPGA, GPP 732 may program and configure flash controllers 740 during start-up of data storage system 620. After startup, in general operation flash controllers 740 receive read and write requests from gateway 730 that request to read data stored in NAND flash memory system 750 and/or to store data in NAND flash memory system 750. Flash controllers 740 service these requests, for example, by accessing NAND flash memory system 750 to read or write the requested data from or into NAND flash memory system 750 or by accessing a memory cache (not illustrated) associated with NAND flash memory system 750.

Flash controllers 740 implement a flash translation layer (FTL) that provides logical-to-physical address translation to enable access to specific memory locations within NAND flash memory systems 750. In general, an I/O request received by a flash controller 740 from a host device, such as a processor system 602, contains the logical block address (LBA) at which the data is to be accessed (read or written) and, if a write request, the write data to be stored to data storage system 620. The I/O request may also specify the amount (or size) of the data to be accessed. Other information may also be communicated depending on the protocol and features supported by data storage system 620. The flash translation layer translates LBAs received from a RAID controller 624 into physical addresses assigned to corresponding physical location in NAND flash memory systems 750. Flash controllers 740 may perform address translation and/or store mappings between logical and physical addresses in a logical-to-physical translation data structure, such as a logical-to-physical translation table (LPT), which may conveniently be stored in flash controller memory 742.

NAND flash memory systems 750 may take many forms in various embodiments. In the embodiment shown in FIG. 7, each NAND flash memory system 750 includes multiple (e.g., 32) individually addressable NAND flash memory storage devices 752. In the illustrated example, the flash memory storage devices 752 take the form of a board-mounted flash memory modules, for example, Single Level Cell (SLC), Multi-Level Cell (MLC), Three Level Cell (TLC), or Quad Level Cell (QLC) NAND flash memory modules. The fidelity of data read from flash memory storage devices 752 is preferably enhanced through the implementation of ECC encoding, for example, by flash controllers 740 and/or high level controllers, such as GPPs 732 or RAID controllers 624. In the illustrated embodiment, ECC encoding and decoding is implemented at least in flash controllers 740 by an encoder 744 and decoder 746.

Figure 8:
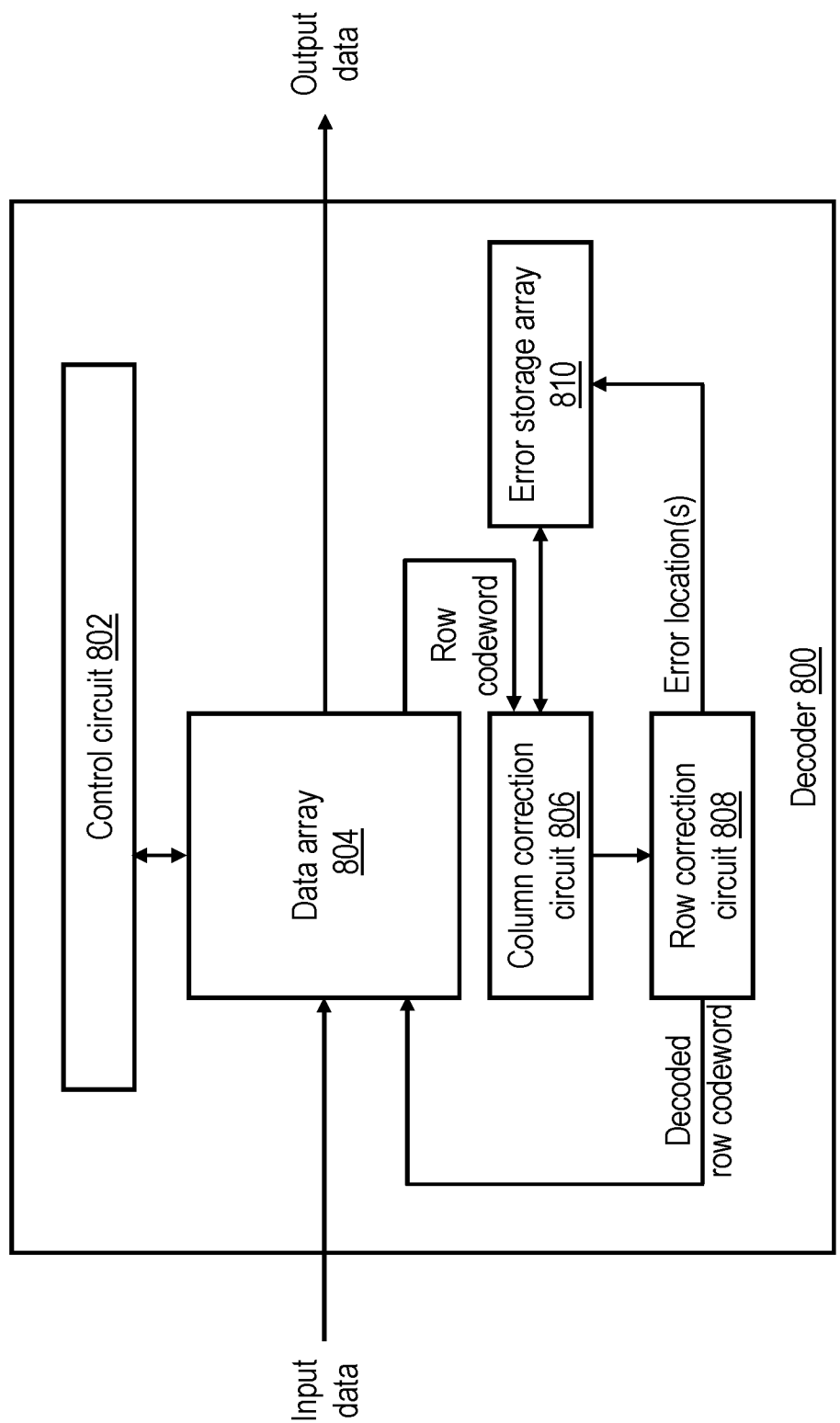
FIG. 8 illustrates an exemplary decoder in accordance with one embodiment.

Referring now to FIG. 8, there is illustrated an exemplary embodiment of a decoder 800 in accordance with one embodiment. Decoder 800, which can be utilized to implement any of decoders 412, 512, or 746, decodes data that has been encoded utilizing a binary symmetry-invariant product code (e.g., an HPC).

As shown in FIG. 8, decoder 200 includes a control circuit 802 that controls the decoding of uncorrected codewords encoded utilizing a binary symmetry-invariant product code. In addition, decoder 800 includes a data array 804 that buffers the binary symmetry-invariant product code as it is decoded. As is conventional, data array 804 includes orthogonal, equally sized first and second dimensions, referred to herein as rows and columns, respectively. In contrast to conventional decoders, data array 804 preferably includes circuitry that allows a binary symmetry-invariant product code buffered therein to be accessed for decoding along only one of its first and second dimensions, but not the other. Such a limitation greatly reduces the expense of implementing decoder 800 in hardware circuitry. For simplicity, it is hereafter assumed that data array 804 is accessed only by rows and not by columns; it should be understood, however, that the choice of accessed dimension is entirely arbitrary given the data symmetry of the binary symmetry-invariant product code buffered in data array 804.

Data array 804 is coupled to a column correction circuit 806 that is configured to correct individual bit location(s) within a row codeword read out from data array 804 as needed and "on the fly" based on error location information stored within an error storage array 810. The row codeword, as possibly modified by column corrector circuit 806, is then fully decoded by row correction circuit 808. Row correction circuit 808 may implement, for example, a Bose-Chaudhuri-Hocquenghem (BCH) error correction function, as is known in the art. Based on the decoding of the row codeword, row correction circuit 808 records location(s) of any corrected errors within error storage array 810. In addition, row correction circuit 808 writes the decoded row codeword (with any corrections made by column correction circuit 806 and/or row correction circuit 808) back into data array 804.

Figure 9:
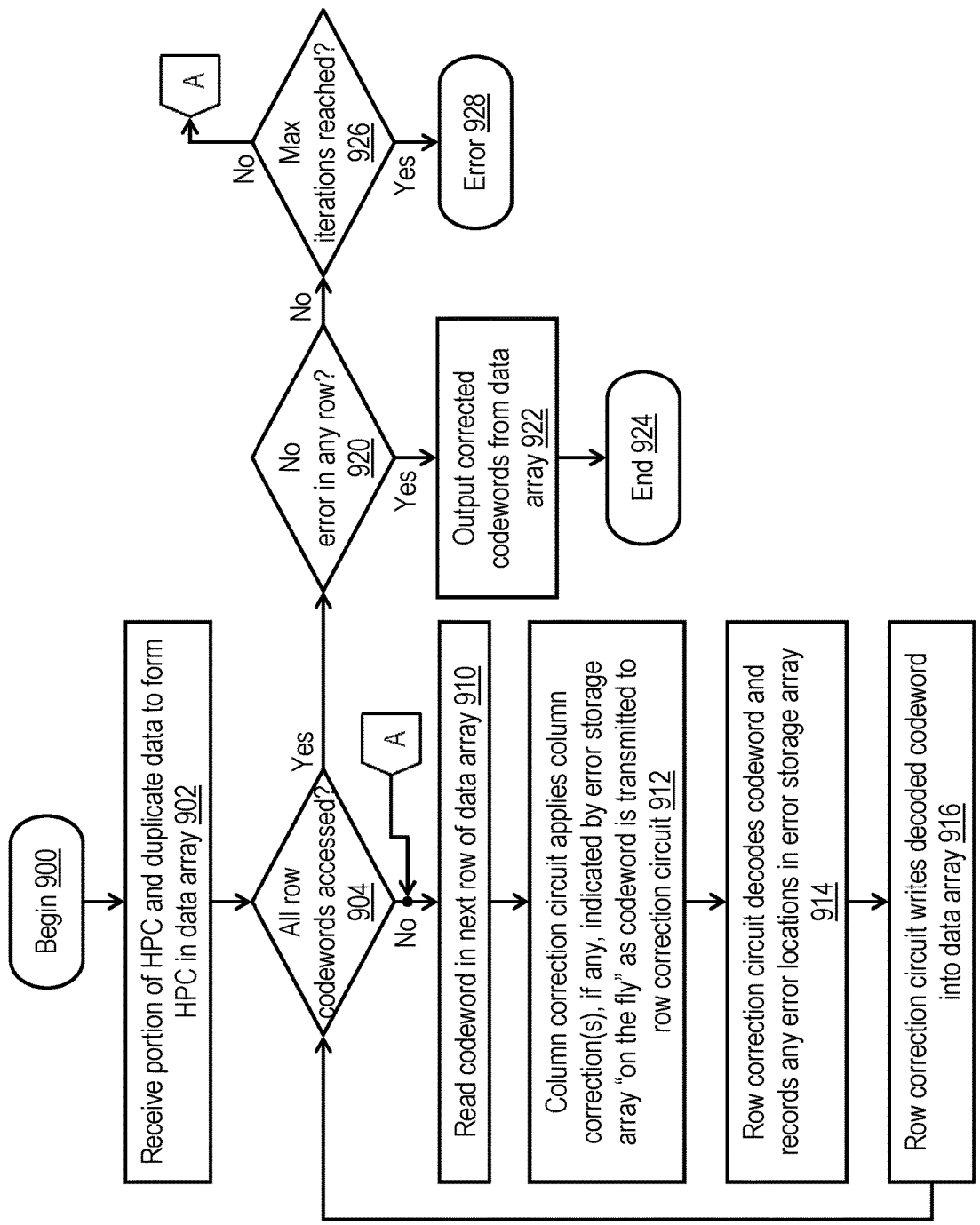
FIG. 9 is a high-level logical flowchart of an exemplary process by which a decoder decodes a binary symmetry-invariant product code in accordance with one embodiment.

With reference now to FIG. 9, there is illustrated a high-level logical flowchart of an exemplary process by which a decoder, such as decoder 800 of FIG. 8, decodes a binary symmetry-invariant product code in one embodiment. The process of FIG. 9 begins at block 900 and then proceeds to block 902, which illustrates decoder 800 receiving a portion of a binary symmetry-invariant product code, hereinafter assumed to be an HPC. As noted above, the HPC can be received by decoder 800, for example, from a recording channel 402 of data storage system 400 or a transmission link 504 of a data communication system 500. In response to receipt of the portion of the HPC, control circuit 802 of decoder 800 fills a portion of data array 804 with the received portion of the HPC (e.g., the triangular portion of the array below the zero major diagonal) and duplicates the data within the received portion of the HPC to form a full data-symmetric HPC within data array 804.

Following block 902, control circuit 802 directs the iterative decoding of the HPC along only a single dimension of data array 804. Thus, in one example, control circuit 802 causes the HPC to be accessed and decoded by row codewords, but not by column codewords. By eliminating access of HPC along a second dimension, the latency of decoding the HPC is reduced by as much as half.

Control circuit 802 begins the iterative decoding process at block 904 by determining whether or not all row codewords of the HPC buffered within data array 804 have been accessed for decoding. If so, the process passes to block 920, which is described below. If not, the process proceeds to block 910. At block 910, control circuit 802 causes the first or next row codeword of the HPC to be read out of data array 804. As shown at block 912, as the row codeword is transmitted to row correction circuit 808 for decoding, column correction circuit 806 corrects (i.e., inverts) "on the fly" any bits of the row codeword identified by error storage array 808 as containing errors and forwards the row codeword with any such corrections to row correction circuit 808. In response to receipt of the row codeword as possibly modified by column correction circuit 806, row correction circuit 808 decodes the codeword utilizing the parity portion of the codeword to correct any errors (block 914). As noted above, in one embodiment row correction circuit 808 may utilize, for example, a convention BCH error correction function. As further indicated at block 914, if any errors are corrected in the row codeword, row correction circuit 808 records the error location(s) in error storage array 810, thus permitting column correction circuit 806 to utilize the error location information to correct bits in one or more additional row codewords based upon the known data symmetry of the HPC. At block 916, row correction circuit 808 writes the decoded row codeword back into its original location in data array 802. Thereafter, the process returns to block 904.

Referring now to block 920, control circuit 802 determines whether or not any errors were detected in any of the row codewords of the HPC during the last iteration through all of the row codewords. If no errors were detected in any of the row codewords during the last iteration, then the HPC was successfully decoded, and the process passes to block 922, which depicts control circuit 802 causing the row codewords of the decoded HPC to be output from data array 804, for example, to a processor system 602 or to a component of a data communication system 500. Thereafter, the process of FIG. 9 ends at block 924. If, however, control circuit 802 determines at block 920 that at least one error was found in at least one row codewords during the last iteration through all of the row codewords of the HPC, control circuit 802 determines at block 926 whether or not a maximum number of iterations (e.g., 3) through the row codewords of the HPC have been performed. If not, the process of FIG. 9 returns through page connector A to block 910 and following blocks, which have been described. If, however, control circuit 802 determines at block 926 that the maximum number of iterations through all of the row codewords of the HPC have been performed, the process of FIG. 9 terminates with an error at block 928, and decoder 800 initiates any required error handling.

Referring now to FIGS. 10-13, an example is given of the correction of errors in an exemplary HPC by the decoder of FIG. 8 utilizing the process of FIG. 9. In this example, data array 804 has 20 rows and 20 columns, which are numbered from R0 to R19 and C0 to C19, respectively. In this example, it is assumed that HPCs are encoded utilizing a Bose-Chaudhuri-Hocquenghem (BCH) error correction function that is able to correct up to three errors in a given row (or column) at zero latency. As a result of this error correcting capability, error storage array 810 preferably includes the capacity to store up to three error locations per row. Error storage array is initialized to all "invalid" values (the empty state), so that column correction circuit 806 will not initially perform any corrections on a row codeword read out of data array 804.

Figure 10:
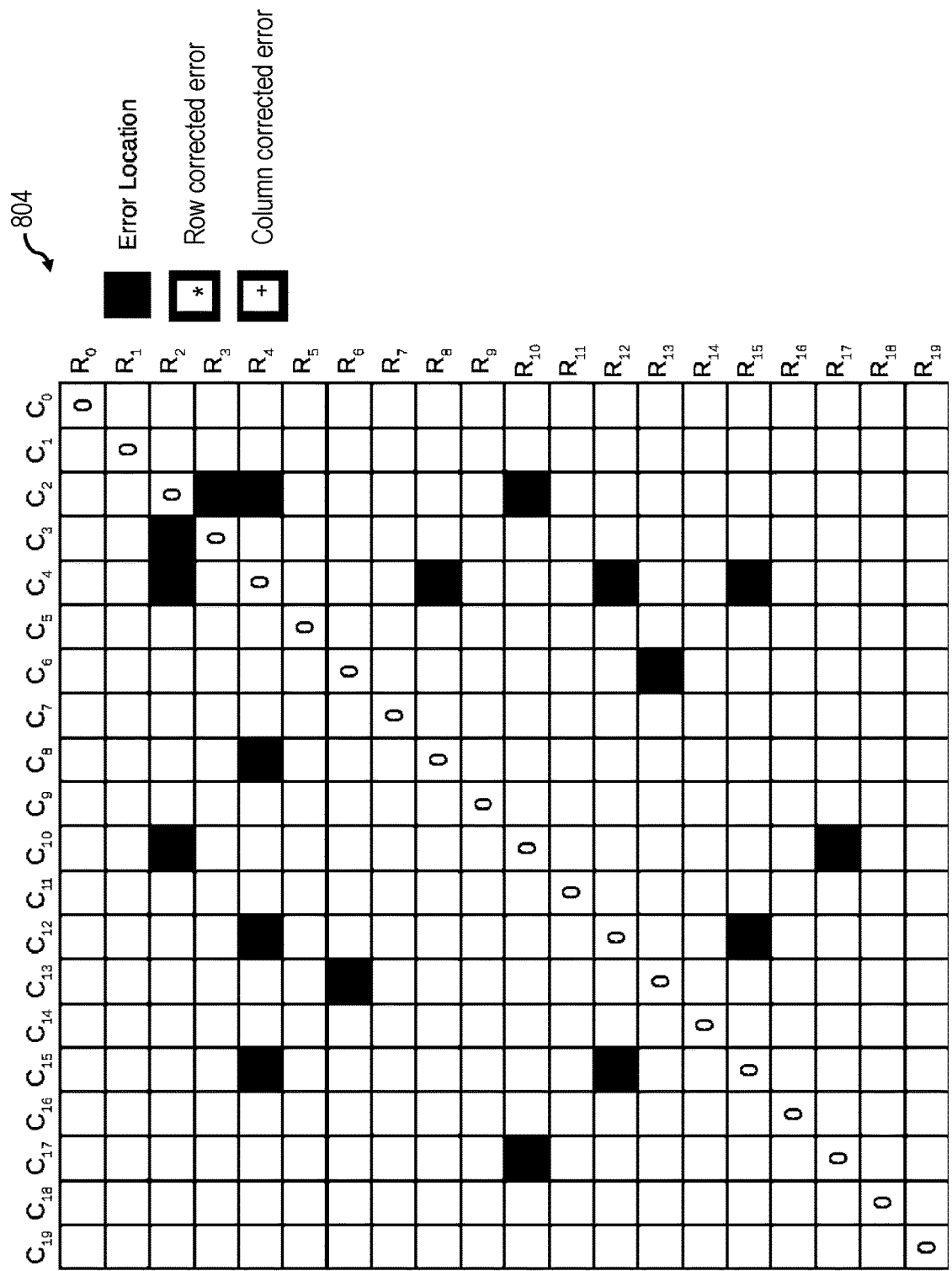
FIGS. 10-13 depict correction of errors in an exemplary HPC by a decoder in accordance with one embodiment.

After a full input HPC is established in data array 804, control circuit 802 causes row codewords to be iteratively and sequentially read out from data array 804 and passed through collection correction circuit 806 to row correction circuit 808 for BCH decoding, beginning with row R0. As indicated in FIG. 10, the row codewords in rows R0 and R1 do not contain any errors, but the row codeword in row R2 initially contains three errors in columns C10, C4 and C3. In response to detecting these bit errors, row correction circuit 808 updates error storage array 810, which can be represented as shown in Table I. As indicated, error storage array 810 records three errors to be fixed, namely, the bits in column C2 in rows R3, R4, and R10. As should be observed, these three errors are symmetrical to the errors detected in columns C3, C4, and C10 of row R2.

TABLE I

| | Column Numbers to be Corrected | | | | | | | |
|---|---|---|---|---|---|---|---|---|
| | 19 | 18 | ... | 4 | 3 | 2 | 1 | 0 |
| Error Location 2 | Invalid | Invalid | Invalid | Invalid | Invalid | 10 | Invalid | Invalid |
| Error Location 1 | Invalid | Invalid | Invalid | Invalid | Invalid | 4 | Invalid | Invalid |
| Error Location 0 | Invalid | Invalid | Invalid | Invalid | Invalid | 3 | Invalid | Invalid |

Figure 11:
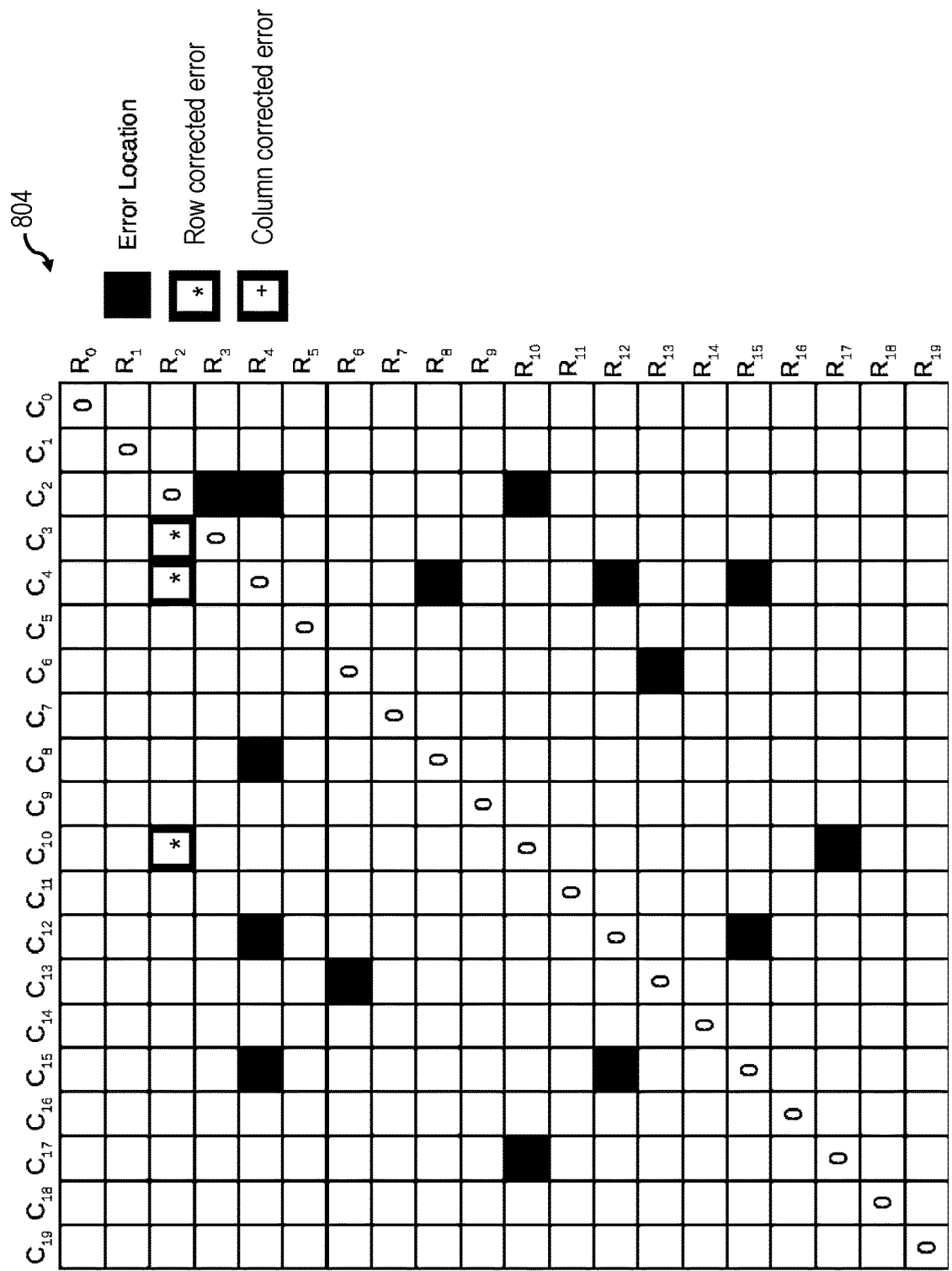

Following the correction of the errors in row R2, row correction circuit 808 updates data array 804, which will then become temporarily asymmetrical as depicted in FIG. 11.

Figure 12:
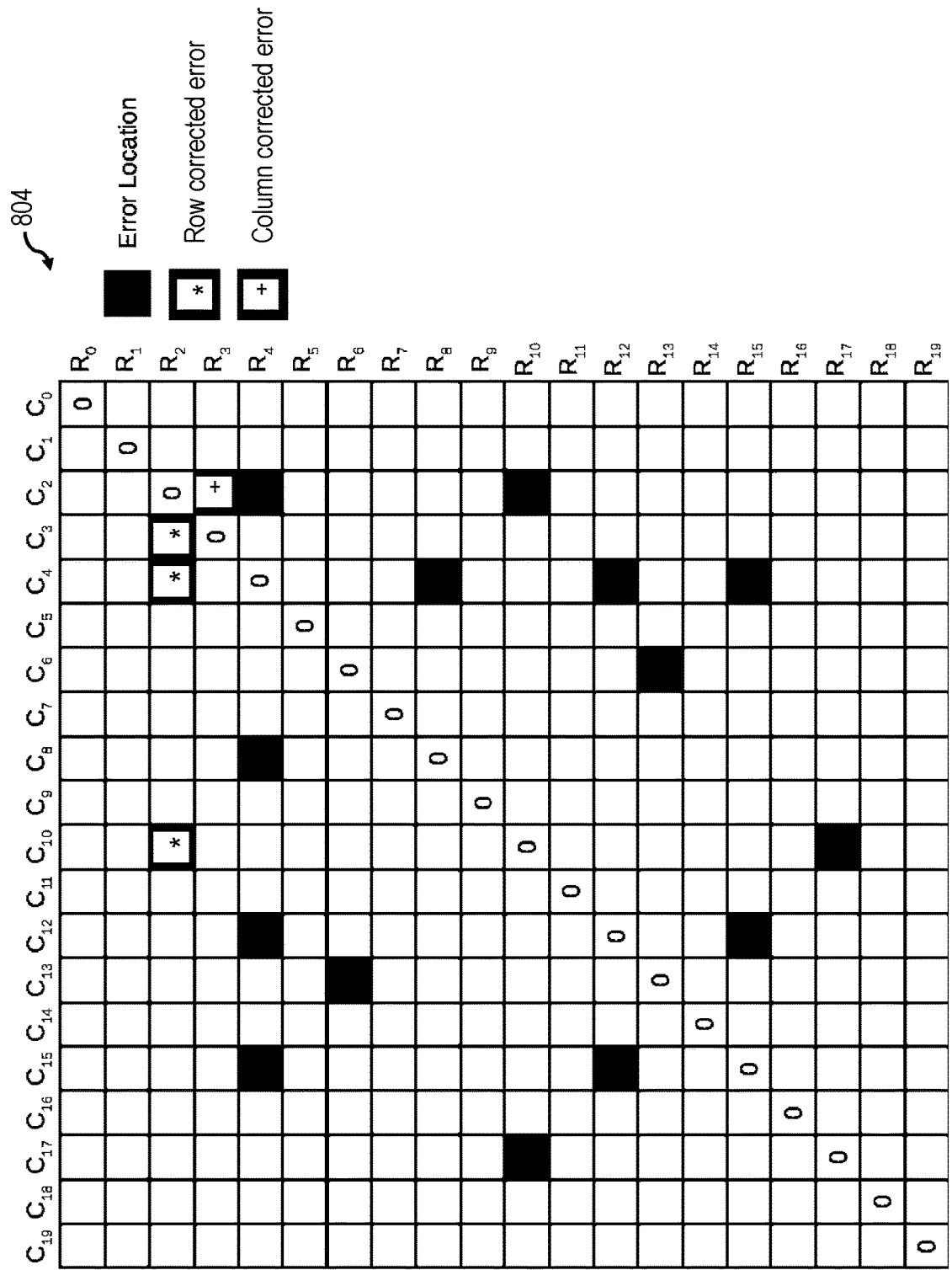

Continuing with the example, the row codeword in row R3 is next read out from data array 804 and passed through column correction circuit 806 to row correction circuit 808. As this row codeword is transmitted, column correction circuit 806 corrects the error in column C2 and updates error storage array 810 to remove the "3" from the entry corresponding to column C2 in the error storage array 810. When row correction circuit 808 performs BCH decoding for the row codeword of row R3, no errors are found because the only error has already been corrected by the column correction circuit 806 before the row codeword was received by row correction circuit 808. Accordingly, row correction circuit 808 does not store any new error locations into error storage array 810, which will then appear as shown in Table II, below. After row correction circuit 808 writes the corrected row codeword back into row R3, data array 804 will appear as shown in FIG. 12.

TABLE II

| | Column Numbers to be Corrected | | | | | | | |
|---|---|---|---|---|---|---|---|---|
| | 19 | 18 | ... | 4 | 3 | 2 | 1 | 0 |
| Error Location 2 | Invalid | Invalid | Invalid | Invalid | Invalid | Invalid | Invalid | Invalid |
| Error Location 1 | Invalid | Invalid | Invalid | Invalid | Invalid | 10 | Invalid | Invalid |
| Error Location 0 | Invalid | Invalid | Invalid | Invalid | Invalid | 4 | Invalid | Invalid |

Figure 13:
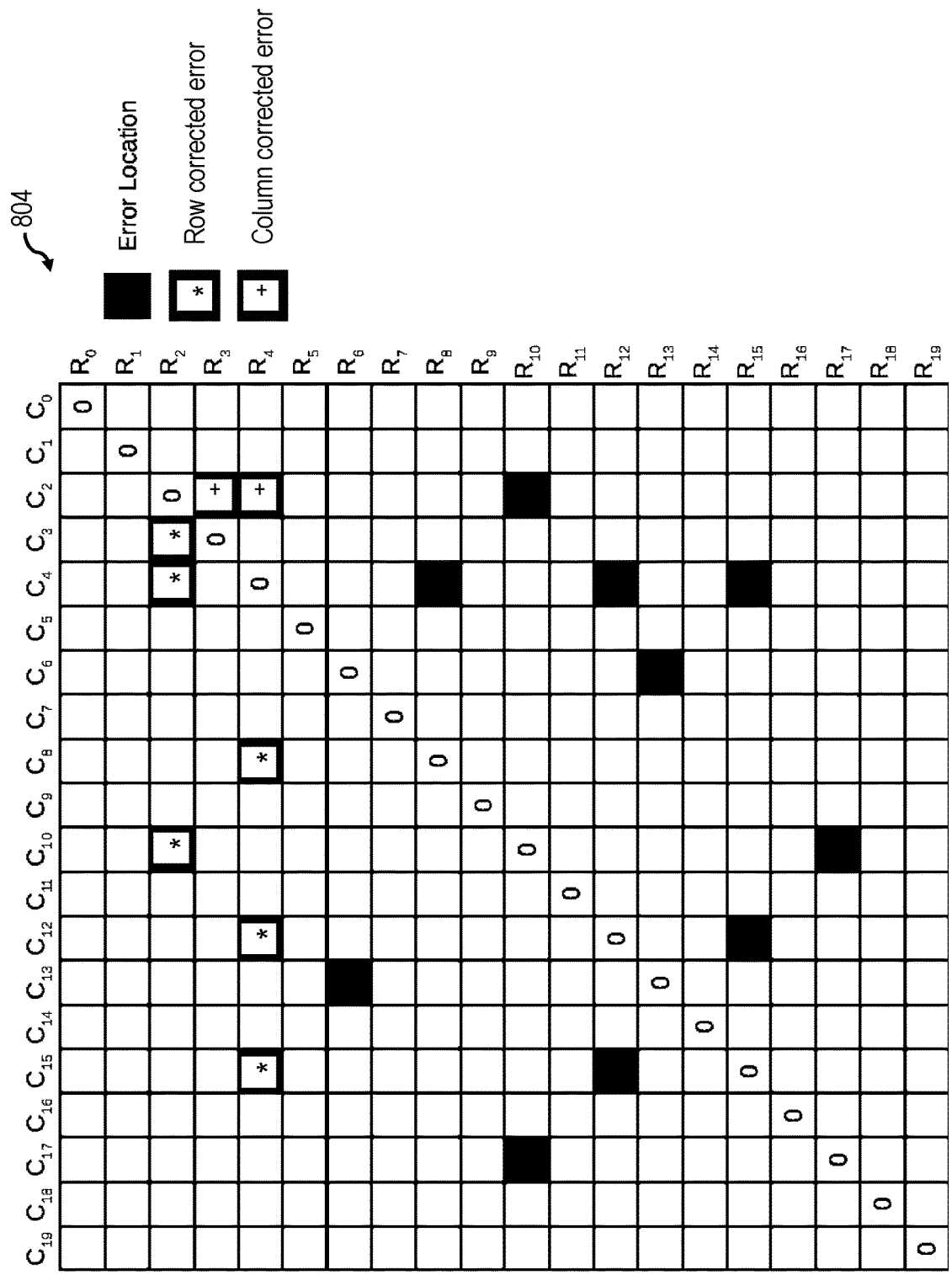

The row codeword in row R4 is next read out from data array 804 and passes through column correction circuit 806 to row correction circuit 808. As indicated, the row codeword for row R4 initially contains four errors, which is more than can be corrected by the BCH algorithm implemented by row correction circuit 808. However, because column correction circuit 806 corrects the bit in column 2 of the row codeword prior to receipt of the row codeword by row correction circuit 808 based on the information provided by error storage array 810, row correction circuit 808 is able to fully decode the row codeword, given the presence of only 3 rather than 4 errors after column correction. After row correction circuit 808 decodes the row codeword and updates data array 802 and error storage array 810, data array 802 will appear as depicted in FIG. 13 and error storage array 810 will have the state shown in Table III below.

TABLE III

| | Column Numbers to be Corrected | | | | | | | |
|---|---|---|---|---|---|---|---|---|
| | 19 | 18 | ... | 4 | 3 | 2 | 1 | 0 |
| Error Location 2 | Invalid | Invalid | Invalid | 15 | Invalid | Invalid | Invalid | Invalid |
| Error Location 1 | Invalid | Invalid | Invalid | 12 | Invalid | Invalid | Invalid | Invalid |
| Error Location 0 | Invalid | Invalid | Invalid | 8 | Invalid | 10 | Invalid | Invalid |

This decoding process will continue iteratively through row R19. Once the first iteration of through all rows of data array 802 is complete, error storage array 810 is not cleared, and the second iteration starts. This process will continue until one of two exit conditions is met: (1) the HPC contains no errors (i.e., all row codewords of the HPC are decoded by row correction circuit 808 without finding any errors) or (2) a maximum iteration limit is reached (i.e., HPC is not corrected).

In the foregoing description, the effects of latency and pipelining in a practical hardware implementation have been neglected for ease of description. To illustrate the additional impact of latency and pipelining, assume the latency of the row correction circuit 808 is five cycles, meaning that when a particular row codeword begins BCH decoding the resulting corrections will not be available until 5 clock cycles later. With this assumption, the locations of the errors in row R2 will not be available for the correction of subsequent rows until row R7 is entering row correction circuit 808. Consequently, although row correction circuit 808 will record corrections to column C2 of rows R3, R4, and R10 in error storage array 810 based on decoding row R2, the codewords of rows R3 and R4 will be received in row correction circuit 808 before this error location information becomes available. As a consequence, the row codeword of rows R3 and R4, which in the ideal zero-latency case can be column corrected "on the fly" by column correction circuit 806 during the same iteration through data array 804 in which the errors in row R2 are detected, are already processed by row correction circuit 808 by the time error storage array 810 reflects the error locations in these row codewords. Fortunately, the failure of column correction circuit 806 to correct these column errors on this first iteration will not affect the ultimate outcome of BCH decoding because column correction circuit 806 will utilize any error location information recorded in error storage array 810 to correct bits (e.g., the bits in column C2 of the row codewords of rows R3 and R4) on the next pass. Simulation and analysis demonstrate that latency, as described, does not lead to any significant loss of decoding performance versus the ideal zero-latency case.

In a preferred embodiment, row correction circuit 808 is designed with knowledge of its decoding latency and orders the storage of error locations in error storage array in accordance with its decoding latency. Thus, for example, row correction circuit 808 may intelligently order the storage, within error storage array 810, of the error location in column C2 of row R10 prior to the storage of the error location in column C2 of rows R3 and R4. This intelligent ordering of the storage of error locations in error storage array 810 ensures that, to the maximum extent possible, symmetric errors (e.g., the error in column C2 of row R10) can be corrected by column correction circuit 806 during the same iteration through the row codewords in which the corresponding error was detected.

The example provided above also does not explicitly discuss the effects of parallelism. In at least some embodiments, it is desirable to increase decoding throughput through the implementation of parallel instances of column correction logic within column correction circuit 806 and parallel instances of decoding logic within row correction circuit 808. For example, in one embodiment, row correction circuit 808 may include four instances of decoding logic capable of decoding four codewords per clock cycle, and column correction circuit 806 may similarly include four instances of column correction logic capable of correcting bits within four codewords per clock cycle. In such embodiments, it is preferred if one instance of logic processes the row codewords of rows R0, R4, R8, R12, . . . , a second instance of logic processes the row codewords of rows R1, R5, R9, R13, etc. as determined by the dimension of the data array modulo the number of logic instances. It should be noted that the error locations corrected by any of the instances of column correction logic can be detected by any of the instances of decoding logic.

As has been described, in at least one embodiment, a decoder for decoding a binary symmetry-invariant product code includes a data array having orthogonal first and second dimensions. The data array is configured to access a binary symmetry-invariant product code buffered therein along only the first dimension. The decoder also includes an error storage array for storing error locations and a first correction circuit configured to detect and correct errors in data accessed from the data array along the first dimension and to store error locations along the second dimension in the error storage array. The first correction circuit determines the error locations based on data symmetry of the symmetry-invariant product code. The decoder also includes a second correction circuit that, prior to receipt by the first correction circuit of data accessed from the data array along the first dimension, corrects the data accessed from the data array based on the error locations stored in the error storage array.

The described embodiments can provide significant advantages over prior art decoders in both cost and performance. For example, by eliminating the requirement that the binary symmetry-invariant product code be accessed along both dimensions, significant circuitry expense and area is saved, particularly for larger binary symmetry-invariant product codes, which may be three hundred or more bits in each dimension. In addition, by eliminating the need to access the binary symmetry-invariant product code along both dimensions, decoding latency can be reduced by up to half. Further, the described embodiments leverage data symmetry to correct symmetric errors "on the fly" rather than waiting for such symmetric errors to be "rediscovered" and corrected during the decoding of a subsequent codeword.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the present invention has been particularly shown as described with reference to one or more preferred embodiments, it will be understood by those skilled in the art that various changes in form and detail may be made therein without departing from the spirit and scope of the invention. For example, although aspects have been described with respect to a data storage system including a flash controller that directs certain functions, it should be understood that present invention may alternatively be implemented as a program product including a storage device storing program code that can be processed by a processor to perform such functions or cause such functions to be performed. As employed herein, a "storage device" is specifically defined to include only statutory articles of manufacture and to exclude signal media per se, transitory propagating signalsper se, and forms of energy per se.

In addition, although embodiments have been described that include use of a NAND flash memory, it should be appreciated that embodiments of the present invention can also be used with any other type of non-volatile random access memory (NVRAM).

The figures described above and the written description of specific structures and functions below are not presented to limit the scope of what Applicants have invented or the scope of the appended claims. Rather, the figures and written description are provided to teach any person skilled in the art to make and use the inventions for which patent protection is sought. Those skilled in the art will appreciate that not all features of a commercial embodiment of the inventions are described or shown for the sake of clarity and understanding. Persons of skill in this art will also appreciate that the development of an actual commercial embodiment incorporating aspects of the present inventions will require numerous implementation-specific decisions to achieve the developer's ultimate goal for the commercial embodiment. Such implementation-specific decisions may include, and likely are not limited to, compliance with system-related, business-related, government-related and other constraints, which may vary by specific implementation, location and from time to time. While a developer's efforts might be complex and time-consuming in an absolute sense, such efforts would be, nevertheless, a routine undertaking for those of skill in this art having benefit of this disclosure. It must be understood that the inventions disclosed and taught herein are susceptible to numerous and various modifications and alternative forms. Lastly, the use of a singular term, such as, but not limited to, "a" is not intended as limiting of the number of items.

What is claimed is:

1. A decoder for decoding a binary symmetry-invariant product code, the decoder comprising circuitry including:
   a data array having orthogonal first and second dimensions, wherein the data array is configured to access a binary symmetry-invariant product code buffered therein along only the first dimension;
   an error storage array for storing error locations;
   a first correction circuit configured to detect and correct errors in data accessed from the data array along the first dimension and to store error locations along the second dimension in the error storage array, wherein the first correction circuit determines the error locations based on data symmetry of the symmetry-invariant product code; and
   a second correction circuit that, prior to receipt by the first correction circuit of data accessed from the data array along the first dimension, corrects the data accessed from the data array based on the error locations stored in the error storage array.

2. The decoder of claim 1, wherein the binary symmetry-invariant product code is a half product code (HPC).

3. The decoder of claim 1, wherein the data array is configured to access the binary symmetry-invariant product code buffered therein only by rows.

4. The decoder of claim 1, wherein the first correction circuit updates the data array with corrected data.

5. The decoder of claim 4, wherein the decoder iteratively accesses codewords of the binary symmetry-invariant product code buffered in the data array along only the first dimension such that at least some of the codewords are accessed along the first dimension multiple times.

6. The decoder of claim 5, wherein the decoder discontinues iteratively accessing codewords of the binary symmetry-invariant product code based on a first to occur of reaching a predetermined number of iterations and detecting no errors in the binary symmetry-invariant product code.

7. The decoder of claim 1, wherein:
   the first correction circuit is configured to decode multiple codewords per clock cycle; and
   the second correction circuit is configured to apply corrections indicated by the error storage array to multiple codewords per clock cycle.

8. The decoder of claim 1, wherein:
   the first correction circuit orders storage of the error locations in the error storage array in accordance with a latency of the decoder.

9. A data storage system, comprising:
   a non-volatile memory system; and
   a controller coupled to a non-volatile memory system, wherein the controller includes the decoder of claim 1.

10. A data communication system, comprising:
    a demodulator configured to receive modulated encoded data from a communication channel, demodulate the modulated encoded data, and output encoded data; and
    the decoder of claim 1, wherein the decoder is coupled to the demodulator to receive, as an input, encoded data including the binary symmetry-invariant product code.

11. A method of decoding a binary symmetry-invariant product code, the method comprising:
    accessing a binary symmetry-invariant product code buffered in a data array having orthogonal first and second dimensions along only the first dimension;
    a first correction circuit detecting and correcting errors in data accessed from the data array along the first dimension;
    the first correction circuit determining error locations along the second dimension in an error storage array based on data symmetry of the symmetry-invariant product code and storing the error locations in an error storage array; and
    prior to receipt by the first correction circuit of data accessed from the data array along the first dimension, a second correction circuit correcting the data accessed from the data array based on the error locations stored in the error storage array.

12. The method of claim 11, wherein the binary symmetry-invariant product code is a half product code (HPC).

13. The method of claim 11, wherein the accessing comprises accessing the binary symmetry-invariant product code buffered in the data array only by rows.

14. The method of claim 11, and further comprising the first correction circuit updating the data array with corrected data.

15. The method of claim 14, wherein the accessing comprises iteratively accessing codewords of the binary symmetry-invariant product code buffered in the data array along only the first dimension such that at least some of the codewords are accessed along the first dimension multiple times.

16. The decoder of claim 15, and further comprising discontinuing iteratively accessing codewords of the binary symmetry-invariant product code based on a first to occur of reaching a predetermined number of iterations and detecting no errors in the binary symmetry-invariant product code.

17. The method of claim 11, wherein:
    the first correction circuit detecting and correcting errors comprises the first correction circuit detecting and correcting errors in multiple codewords per clock cycle; and
    the second correction circuit correcting the data comprises the second correction circuit applying corrections indicated by the error storage array to multiple codewords per clock cycle.

18. The method of claim 11, and further comprising:
    the first correction circuit ordering storage of the error locations in the error storage array in accordance with a decoding latency.

19. The method of claim 11, and further comprising retrieving a portion of the binary symmetry-invariant product code from a non-volatile memory system.

20. The method of claim 11, and further comprising receiving a portion of the binary symmetry-invariant product code from a communication link.

* * * * *